(12) United States Patent
Alok

(10) Patent No.: US 6,355,944 B1
(45) Date of Patent: Mar. 12, 2002

(54) SILICON CARBIDE LMOSFET WITH GATE REACH-THROUGH PROTECTION

(75) Inventor: Dev Alok, Danbury, CT (US)

(73) Assignee: Philips Electronics North America Corporation, New York, NY (US)

(*) Notice: Subject to any disclaimer, the term of this patent is extended or adjusted under 35 U.S.C. 154(b) by 0 days.

(21) Appl. No.: 09/469,451

(22) Filed: Dec. 21, 1999

(51) Int. Cl.[7] .......................................... H01L 31/0312
(52) U.S. Cl. ...................... 257/77; 257/288; 257/330; 257/328; 438/163
(58) Field of Search ........................... 257/77, 288, 330, 257/332, 336, 328, 76; 438/163

(56) References Cited

U.S. PATENT DOCUMENTS

| | | | |
|---|---|---|---|
| 5,726,463 A | * 3/1998 | Brown et al. | 257/77 |
| 5,915,180 A | 6/1999 | Hara et al. | 438/270 |
| 6,011,278 A | * 1/2000 | Alok et al. | 257/76 |
| 6,198,127 B1 | * 3/2001 | Kocon | 257/328 |

FOREIGN PATENT DOCUMENTS

| | | |
|---|---|---|
| JP | 63287064 A | 11/1988 |
| JP | 02110973 A | 4/1990 |
| JP | 11103058 A | * 4/1999 |

OTHER PUBLICATIONS

PHA 23,899, "Self–Aligned Silicon Carbide LMOSFET", filed concurrently herewith.
PHA 23,900, "Silicon Carbide N–Channel Power LMOSFET", filed concurrently herewith.

* cited by examiner

*Primary Examiner*—Nathan Flynn
*Assistant Examiner*—Remmon R. Fordé
(74) *Attorney, Agent, or Firm*—Steven R. Biren

(57) ABSTRACT

A silicon carbide LMOSFET having a self-aligned gate with gate reach-through protection and method for making same. The LMOSFET includes a first layer of SiC semiconductor material having a p-type conductivity and a second layer of SiC semiconductor material having an n-type conductivity formed on the first layer. Source and drain regions having n-type conductivities are formed in the second SiC semiconductor layer. An etched trench extends through the second SiC semiconductor layer and partially into the first SiC semiconductor layer. The trench is coated with a layer of an electrically insulating oxide material and partially filled with a layer of metallic material thereby forming a gate structure. A channel region is defined in the first layer beneath the gate structure. The gate structure is rounded or buried to provide a current path in the channel region which avoids sharp corners.

9 Claims, 4 Drawing Sheets

SILICON CARBIDE LMOSFET WITH GATE REACH-THROUGH PROTECTION

RELATED APPLICATIONS

Commonly-assigned, copending U.S. patent application Ser. No. 09/469,454, entitled "Self-Aligned Silicon Carbide LMOSFET", filed Dec. 12, 1999.

Commonly-assigned, copending U.S. patent application Ser. No. 09/469,450, entitled "Silicon Carbide N-Channel Power LMOSFET", FILED Dec. 12, 1999.

FIELD OF THE INVENTION

This invention relates to lateral metal-oxide-semiconductor field effect transistors (LMOSFETs) used in high-power applications such as UHF transmission which are especially suited for silicon carbide (SiC) technology. In particular, the invention relates to a SiC LMOSFET having a self-aligned gate structure with improved gate reach-through protection and methods of fabricating same.

BACKGROUND OF THE INVENTION

In recent years, the use of silicon lateral double-diffused metal-oxide-semiconductor field effect transistors (Si LDMOSFETs) in high-power and high-frequency applications has increased enormously. This is because Si LDMOSFETs offer simpler gate drive and faster response than bipolar devices.

Si LDMOSFETs are typically fabricated using self-aligned techniques, which minimize gate overlap of the source and drift/drain regions. Minimal overlap is critical for maintaining low gate-to-source and gate-to-drift/drain capacitances, which can adversely affect the high frequency performance of the device. It is also desirable to reduce the overlap to decrease the cell pitch and conserve the silicon area used by the device.

Silicon carbide (SiC) is an attractive semiconductor material for high frequency and high power applications. The properties which make SiC attractive for high power UHF applications are its large critical electric field (10 times that of Si) and its large electron saturation velocity (2 times that of Si). The large critical electric field helps increase the breakdown voltage of the device and the large saturation velocity helps increase the peak current.

FIG. 1 shows an LMOSFET 10 as disclosed in commonly-assigned copending U.S. patent application Ser. No. 09/469,454 entitled "Self-Aligned Silicon Carbide LMOSFET". This SiC LMOSFET includes a self-aligned gate structure and offers protection against gate reach through. The LMOSFET 10 of FIG. 1 includes highly n-doped source and drain regions 11, 12, a lightly n-doped drift region 13 formed by an N- epitaxial layer 14, and an electrically insulated self-aligned gate structure 15 comprised of a gate oxide 16 and a gate metal 17, formed on a lightly-doped p-type SiC epitaxial layer 18 (P-epilayer). The gate structure 15 has edges 19 which are substantially aligned with the edges 20 of the source and drift regions 11, 13. Accordingly, the gate-to-source and gate-to-drift region overlap can be advantageously controlled by the thickness of the gate metal 17, which can be selected to be very small. A channel region 21 in the P- epilayer 18. The channel region 21changes from p-type to n-type due to inversion when a positive voltage greater than the threshold voltage of the LMOSFET 10 is applied to the gate 15 thereby providing a low resistance current path between the source region 11 and drift extension 13 of the drain region 12.

The LMOSFET 10 of FIG. 1 should provide many advantages in terms of better linearity, efficiency and power density at comparable frequencies, and higher frequency operation than Si LDMOSFETs. However, this LMOSFET may suffer from higher forward voltage drop, i.e., higher "on-resistance" due to the fact that the current at the source side has to flow around a corner 22 where the gate oxide 16 has a greater thickness. The greater oxide thickness results in a higher resistivity portion in inversion, which will likely result in higher forward voltage drop.

Therefore, a SiC LMOSFET is needed which overcomes the above problem.

SUMMARY OF THE INVENTION

Summarily described is an LMOSFET having a self-aligned gate with gate reach-through protection and method for making same. The LMOSFET comprises a first layer of SiC semiconductor material having a p-type conductivity and a second layer of SiC semiconductor material having an n-type conductivity formed on the first layer. Source and drain regions having n-type conductivities are formed in the second SiC semiconductor layer. An etched trench extends through the second SiC semiconductor layer and partially into the first SiC semiconductor layer so that the source and drain regions are substantially lateral thereto. The trench is coated with a layer of an electrically insulating oxide material and partially filled with a layer of metallic material thereby forming a gate structure. A channel region is defined in the first layer beneath the gate structure. The source corner of the gate structure is either rounded or surrounded by the source region to provide a current path in the channel region which avoids sharp corners. Electrical contacts associated with the source and drain regions, and the gate structure establish source, drain, and gate electrodes.

BRIEF DESCRIPTION OF THE DRAWINGS

The advantages, nature, and various additional features of the invention will appear more fully upon consideration of the illustrative embodiment now to be described in detail in connection with accompanying drawings wherein.

It should be understood that the drawings are for purposes of illustrating the concepts of the invention and are not to scale.

DETAILED DESCRIPTION OF THE INVENTION

Figure 1:
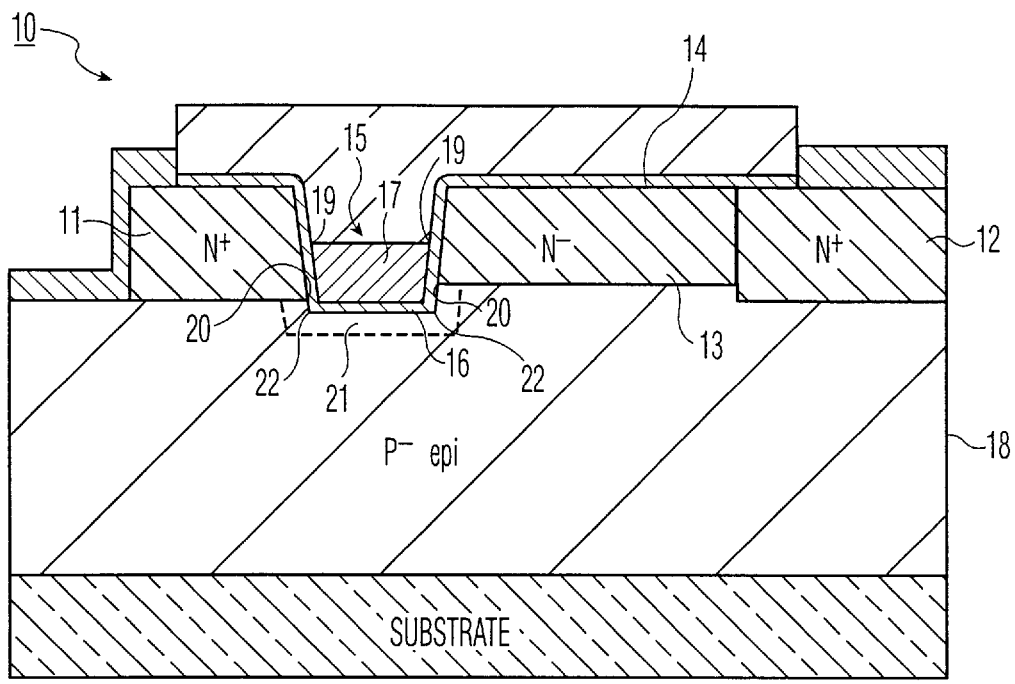
FIG. 1 is a cross-sectional view of a SiC LDMOSFET as disclosed in commonly assigned copending U.S. patent application Ser. No. 09/469,454 entitled "Self-Aligned Silicon Carbide LMOSFET"
Figure 2:
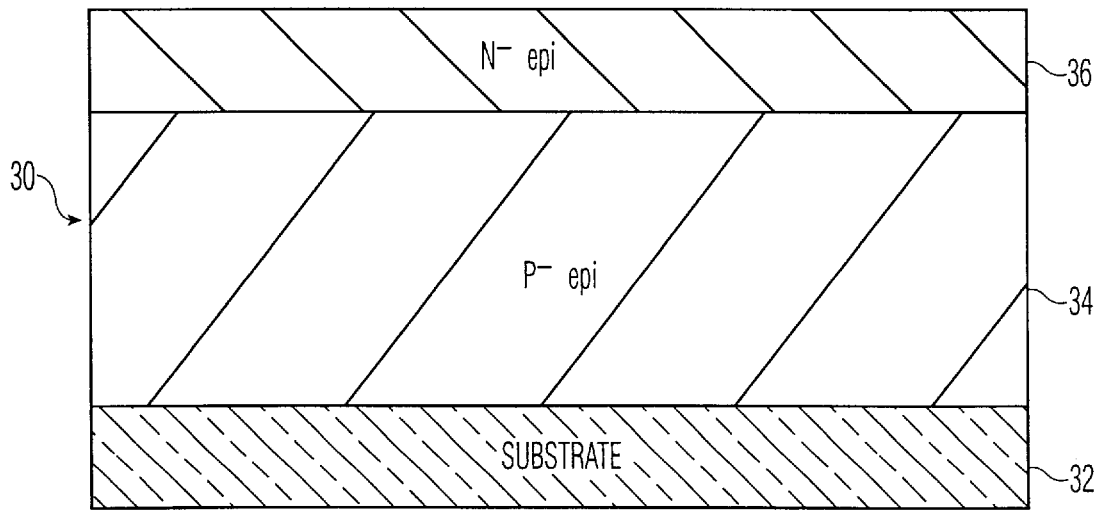
FIG. 2 is a cross-sectional view of a starting wafer used for fabricating a SiC LMOSFET having a self-aligned gate with gate reach-through protection according to a first embodiment of the invention.

FIG. 2 shows a layered wafer 30 used for fabricating a SiC lateral metal-oxide-semiconductor field effect transistor (LMOSFET) having a self-aligned gate structure with improved gate reach-through protection according to an embodiment of the invention. The wafer 30 comprises a substrate 32 with a P-epitaxial layer 34 (P-epilayer) grown on top of the substrate 32, and a lightly-doped n-type epitaxial SiC layer 36 (N-epilayer) grown on top of the P-epilayer 34. The substrate 32 can be made from any suitable n or p doped Si or SiC semiconductor material, or an insulating material such as undoped Si, undoped SiC, or glass. The P- and N-epilayers 34, 36 are epitaxially grown using conventional methods such as chemical vapor deposition CVD, and are doped using conventional aluminum, boron or nitrogen incorporation during epitaxial growth. The thickness and doping of the P-epilayer 34 are selected according to the desired electrical breakdown voltage of the LMOSFET. The thickness (selected to be as small as possible) and doping of the N-epilayer 36 are selected using the reduced surface field (RESURF) effect according to the desired breakdown voltage of the LMOSFET. The doping concentration of the N-epilayer 36 is also selected independent of that of the P-epilayer 34.

Figure 3:
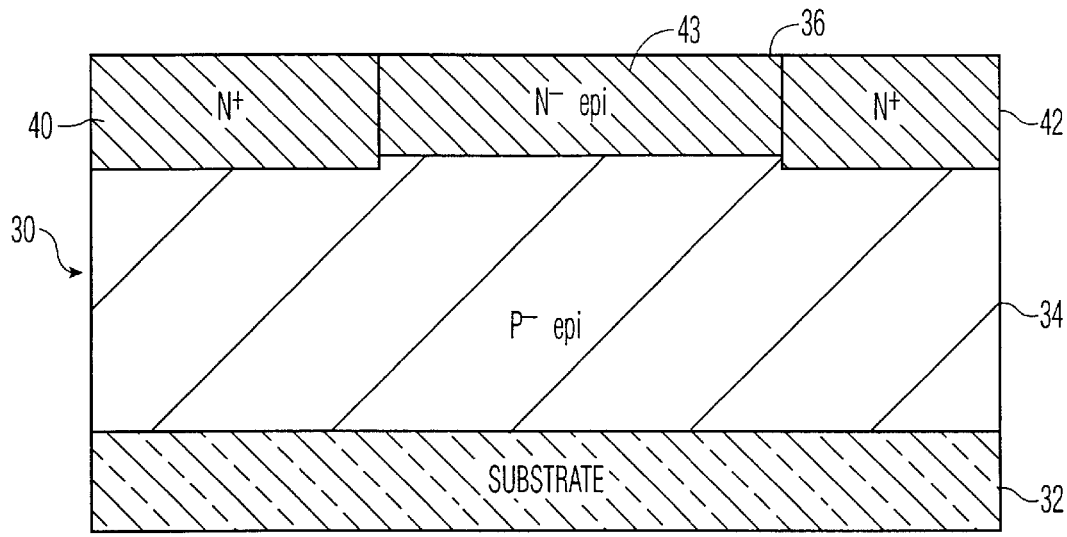
FIGS. 3-5 are cross-sectional views of the wafer of FIG. 2 depicting various steps used in fabrication of the SiC LMOSFET of the invention.

As shown in FIG. 3, source and drain regions 40, 42 are fabricated first in the layered wafer 30 by selectively implanting an N+ dopant in the top surface thereof. The implant depth is selected to be substantially equal to or slightly greater than (as shown) the thickness of the N-epilayer 36. The N+ dopant is then activated using any desired processing temperature. Note that the N-epilayer will advantageously form a lightly n-doped extension of the drain region otherwise known as a drift region 43.

Figure 4:
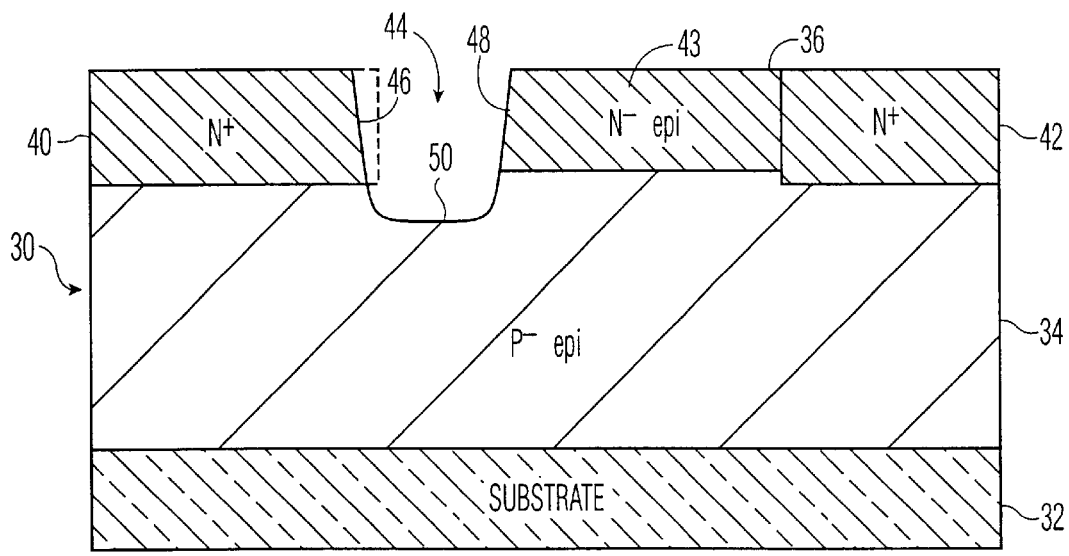

In FIG. 4, a trench 44 is etched through the N-epilayer 36 and partially into the P-epilayer 34. The trench 44 has first and second opposing sides 46, 48 connected by a curved bottom 50 which substantially eliminates sharp corners where the sides 46, 48 and bottom 50 meet by rounding them out. Such a trench geometry can be achieved using conventional reactive ion etching (RIE) techniques and chemical compounds adapted to provide an etching directionality that produces rounding of the trench bottom 50. The rounded trench bottom 50 can also be achieved using wet etching techniques which typically produce trenches with curved bottoms due to the isotropic nature of the etching. The etching should be performed so that the first side 46 of the trench 44 overlaps into the source region 40 and the trench 44 should have a depth which is greater than the depth of the source region 40.

Figure 5:
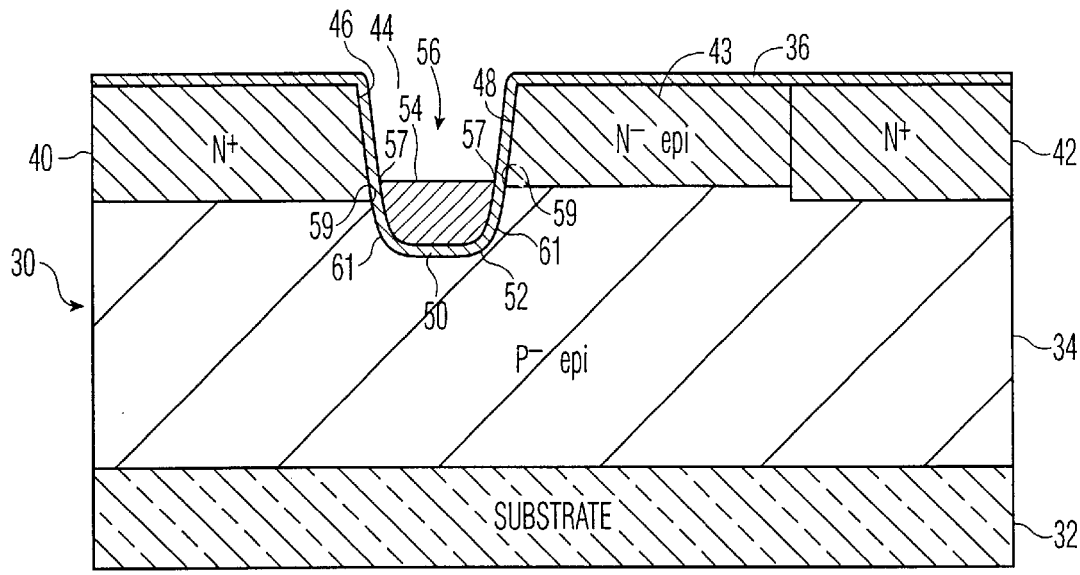

In FIG. 5, a layer 52 of oxide material such as silicon dioxide is formed on the sides 46, 48 and curved bottom 50 of the trench 44 using any preferred conventional method such as deposition, thermal oxidation, or combination thereof The curved trench geometry allows the oxide layer 52 to be formed therein with a uniform thickness. The trench 44 is then partially filled with a layer 54 of metallic material such as polysilicon. The layer 54 metallic material can be deposited in the trench 44 using any preferred conventional method such as sputtering or chemical vapor deposition (CVD). The layer 54 of metallic material in cooperation with the underlying layer 52 of oxide material forms a self-aligned, curved gate structure 56 with rounded corners 61 and edges 57 which are substantially aligned with the edges 59 of the source and drift regions 40, 43. The gate-to-source and gate-to-drift region (edge) overlap can be advantageously controlled by the thickness of the gate metal 54, which can be selected to be very small.

Figure 6:
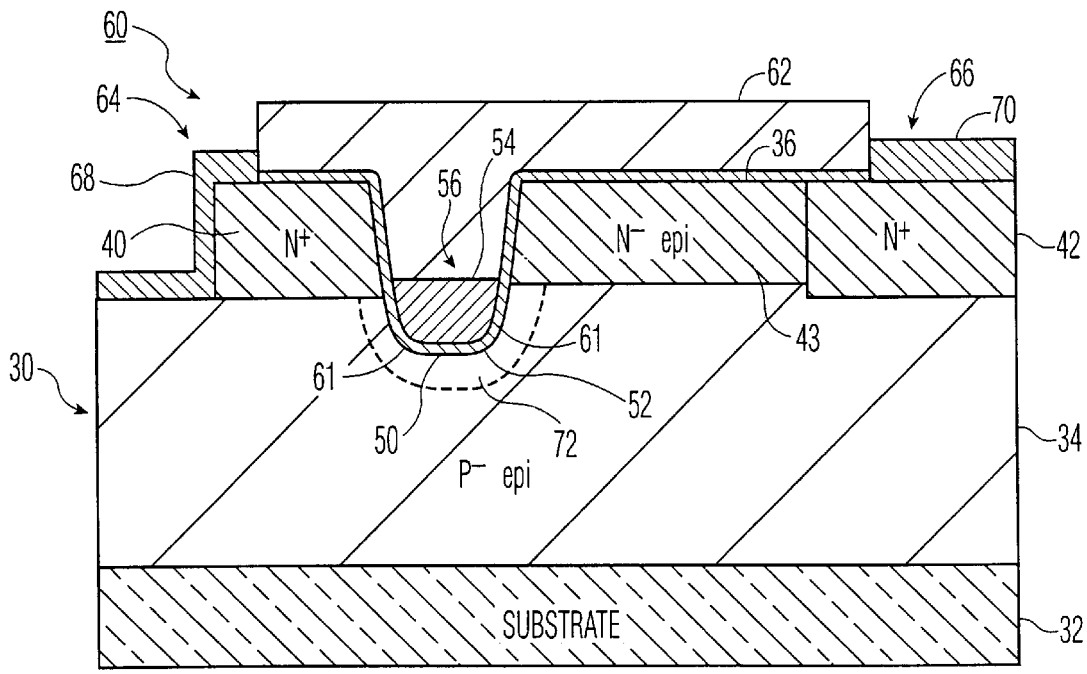
FIG. 6 is a cross-sectional view of the completed SiC LMOSFET according to the first embodiment of the invention.

FIG. 6 shows the completed SiC LMOSFET 60 of the invention. The LMOSFET 60 is finalized by applying a second layer 62 of oxide material such as silicon dioxide over the top of the layered wafer 30 shown in FIG. 5. The second layer 62 of oxide material fills the remainder of the trench 44 and electrically isolates the top of the wafer 30. Windows 64, 66 are defined in the oxide layers 62, 52 to provide access to the source region 40, the self-aligned gate structure 56 (window is located laterally and not visible in this view) and the drain region 42. Finally, electrically conductive contacts 68, 70 to the source region 40, gate 56 (contact not visible) and drain region 42, are deposited in the windows 64, 66 using conventional techniques. The contacts 68, 70 (including the contact not visible in the drawings) and their corresponding source region 40, drain region 42, and gate structure 56, define source, drain, and gate electrodes of the LMOSFET 60.

The LMOSFET 60 includes a channel region 72 defined in the P-epilayer 34 directly beneath the gate electrode structure 56. The channel region 72 changes from p-type to n-type due to inversion when a positive voltage greater than the threshold voltage of the LMOSFET 60 is applied to the gate 56. Because the gate structure 56 is curved with rounded corners 61, carriers in the channel region 72 do not need to make any sharp turns (eliminating sharp turns advantageously makes the gate oxide thickness uniform and decreases the "on-resistance" in the channel region 72) during inversion. Hence, the channel 72 provides a gradually curving, very low resistance current path between the source region 40 and drift region 43 during inversion. This in turn, decreases forward voltage drop in the LMOSFET 60.

Figure 7:
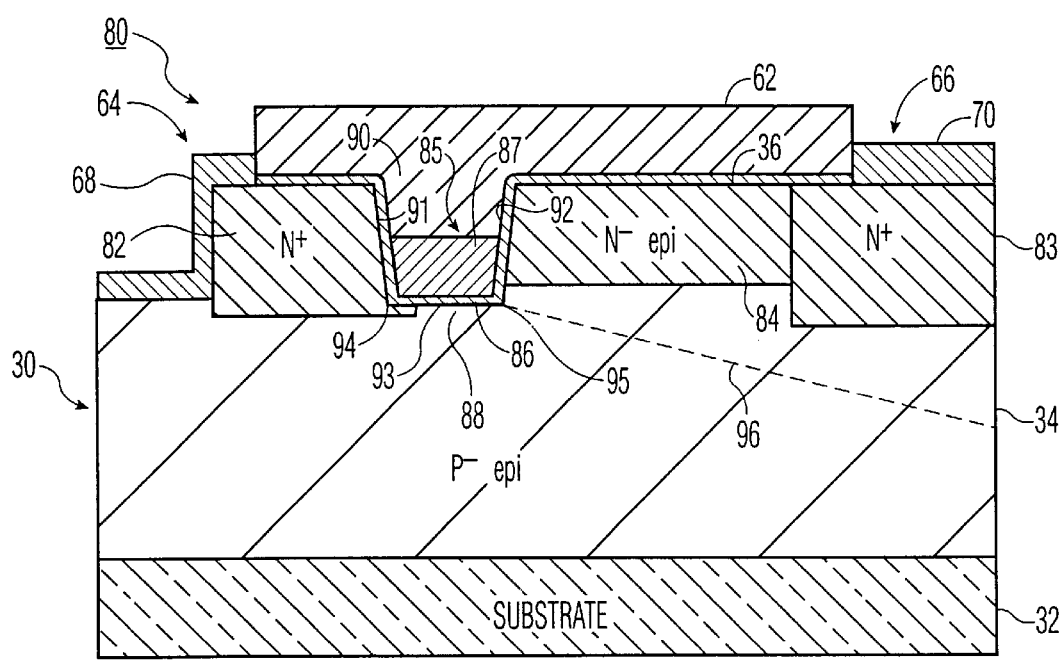
FIG. 7 is a cross-sectional view of a SiC LMOSFET having a self-aligned gate with gate reach-through protection according to a second embodiment of the invention.

FIG. 7 shows a SiC LMOSFET 80 having a self-aligned gate with gate reach-through protection according to a second embodiment of the invention, wherein like numerals identify like elements. This LMOSFET 80 is substantially similar in structure and fabrication to the LMOSFET of FIG. 6 except that the gate structure 85 (comprised of a gate oxide 86 and a gate metal 87) is fabricated with a flat bottom trench 90 that has corners 94, 95 where the sides 91, 92 and bottom 93 meet. Additionally, the source and drain regions 82, 83 have an increased implant depth D such that they now extend entirely through the N-epilayer 36 and significantly into the P-epilayer 34. The increased implant depth D allows the source region 82 to extend below and enclose the source side corner 94 of the gate structure 85 (sacrificing some self-alignment on the source side, i.e., increased gate-to-source region overlap) so that the corner 94 is completely surrounded by the source region 82. This provides a channel region 88 which does not have to turn a corner on the source side of the gate structure 85 thereby lowering the channel resistivity during inversion and consequently reducing forward voltage drop of the LMOSFET 80. The drain side corner 95 of the gate structure 85 does not substantially contribute to increased resistivity during inversion because a depletion layer 96 extending in the P-epilayer 34 aids in sweeping the charge carriers away from the drain side corner 95 of the gate structure 85. Therefore, the carriers move in a generally straight path as they move toward the drift region 84, instead of turning sharply into the drift region 84 as they pass the drain side corner 95 of the gate structure 85.

In addition to providing a self-aligned gate structure with minimal gate-to-source and gate-to-drift region overlap, the present LMOSFET structures advantageously provide channel regions in the P-epilayers. The channel region in each LMOSFET changes from p-type to n-type due to inversion when a positive voltage greater than the threshold voltage of the LMOSFET is applied to the gate thereby providing a low resistance current path between the source region and drift region.

Additional advantages realized with the present LMOSFETs include substantial alleviation of gate reach through as the depletion does not spread laterally towards the source in these designs. The depletion in these structures is restricted to drift region and the P-epilayer underneath the drift region. Further advantages come from the drift region being formed by an N-epilayer which has superior mobility values in comparison to implanted N-layers. Consequently, the epitaxial formed drift region increases the electrical breakdown voltage of the LMOSFET without undesirably increasing the "on-resistance" thereof. The use of the epitaxial formed drift region also provides the designer with greater freedom in specifying the doping concentration and thickness of this region, than drift regions formed using implantation. The LMOSFETs of the invention also have smaller pitch sizes.

Still further, the SiC LMOSFETs of the invention should provide better linearity, efficiency and power density at comparable frequencies, and higher frequency operation than Si LDMOSFETs. Accordingly, the SiC LMOSFETs of the invention can replace Si LDMOSFETs in UHF transmitters at 2 GHz and extend the transmission range up to at least 4 GHz.

While the foregoing invention has been described with reference to the above embodiments, various modifications and changes can be made without departing from the spirit of the invention. Accordingly, all such modifications and changes are considered to be within the scope of the appended claims.

What is claimed is:

1. A lateral metal-oxide-semiconductor field effect transistor (LMOSFET) comprising:

a first layer of silicon carbide semiconductor material having a p-type conductivity;

a second layer of silicon carbide semiconductor material having an n-type conductivity formed on the first layer;

source and drain regions having n-type conductivities formed in the second silicon carbide semiconductor layer, the n-type conductivities of the source and drain regions being greater than then-type conductivity of the second silicon carbide layer;

a trench extending through the second silicon carbide semiconductor layer and partially into the first silicon carbide semiconductor layer, so that the source and drain regions are substantially lateral thereto, the drain region being spaced apart from the trench by a portion of the second layer which forms a drift region, the trench coated with a layer of an electrically insulating oxide material and partially filled with a layer of metallic material, the layers of oxide and metallic material forming a self-aligned gate structure;

a channel region defined in the first layer beneath the gate structure; and electrical contacts associated with the source and drain regions, and the gate structure thereby establishing source, drain, and gate electrodes;

wherein the gate structure is adapted to provide a current path in the channel region which avoids sharp corners.

2. The LMOSFET according to claim 1, further comprising a substrate which supports the first and second silicon carbide semiconductor layers.

3. The LMOSFET according to claim 1, wherein the first layer of silicon carbide semiconductor material is an epitaxial layer.

4. The LMOSFET according to claim 1, wherein the second layer of silicon carbide semiconductor material is an epitaxial layer.

5. The LMOSFET according to claim 4, wherein the epitaxial second layer of silicon carbide semiconductor material defines a drift region that extends laterally from the drain region to the gate structure, the gate structure being substantially aligned with the source and drift regions.

6. The LMOSFET according to claim 1, wherein the source and drain regions each have a depth which is at least equal to the thickness of the second layer of silicon carbide material.

7. The LMOSFET according to claim 6, wherein the trench includes a curved bottom that provides the gate structure with rounded corners.

8. The LMOSFET according to claim 1, wherein the source region extends partially into the first layer of silicon carbide semiconductor material and has a depth which is greater than the depth of the trench.

9. The LMOSFET according to claim 1, wherein the source and drain regions are implanted regions.

* * * * *